United States Patent
Cheng et al.

(10) Patent No.: US 6,737,303 B2
(45) Date of Patent: May 18, 2004

(54) PROCESS FOR FORMING ORGANIC SEMICONDUCTING LAYER HAVING MOLECULAR ALIGNMENT

(75) Inventors: Horng-Long Cheng, Hsinchu (TW); Wei-Yang Chou, Tainan (TW); Chai-Yuan Sheu, Tainan (TW); Yu-Wu Wang, Taichung (TW); Jia-Chong Ho, Taipei (TW); Chi-Chang Liao, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/301,632

(22) Filed: Nov. 22, 2002

(65) Prior Publication Data

US 2004/0043531 A1 Mar. 4, 2004

(30) Foreign Application Priority Data

Aug. 28, 2002 (TW) ........................ 91119506 A

(51) Int. Cl.[7] .......................... H01L 21/00; H01L 21/84
(52) U.S. Cl. ..................... 438/150; 438/29; 438/69; 438/149; 438/168
(58) Field of Search .............................. 438/99, 29, 69, 438/149–168; 257/40, 98

(56) References Cited

U.S. PATENT DOCUMENTS 6,368,681 B1 * 4/2002 Ogawa .................... 428/1.23
6,577,798 B2 * 6/2003 Xu et al. ................... 385/122
6,582,776 B2 * 6/2003 Yip et al. ................... 427/514
6,590,627 B2 * 7/2003 Tomioka et al. ............ 349/139
2003/0133064 A1 * 7/2003 Kondo et al. ............... 349/123
2003/0144466 A1 * 7/2003 Ong et al. .................. 528/397

OTHER PUBLICATIONS

Prasanna Chandrasekhar; Conducting Polymers, Fundamentals and Applications, A Practical Approach; Kluwer Academic Publishers, 1999; pp10–11 and pp. 351–363).*

* cited by examiner

Primary Examiner—John F. Niebling
Assistant Examiner—Jennifer M. Kennedy
(74) Attorney, Agent, or Firm—Birch, Stewart, Kolasch & Birch, LLP

(57) ABSTRACT

A process for forming an organic semiconducting layer having molecular alignment. First, a photoalignment organic layer is formed on a substrate or A dielectric layer. Next, the photoalignment organic layer is irradiated by polarized light through a mask, such that the photoalignment organic layer becomes an orientation layer having molecular alignment. Finally, an organic semiconducting layer is formed on the orientation layer, such that the organic semiconducting layer aligns according to the alignment of the orientation layer to exhibit molecular alignment. The present invention can form an organic semiconducting layer with different molecular alignments in different regions over the same substrate by means of polarized light exposure through a mask.

6 Claims, 4 Drawing Sheets

PROCESS FOR FORMING ORGANIC SEMICONDUCTING LAYER HAVING MOLECULAR ALIGNMENT

BACKGROUND OF THE INVENTION

1. Field of the Invention

The present invention relates to a process for forming an organic semiconducting layer having molecular alignment, and more particularly to a process for forming an organic semiconducting layer having molecular alignment by means of polarized light exposure through a mask.

2. Description of the Prior Art

In recent years, organic semiconducting material has drawn many researchers' attention and has proven to be one of the most popular candidates in fabrication of thin film transistors (TFTs) and various electronic and optoelectronic devices. Sirringhaus et al. in University of Cambridge use self-organization to produce organic thin film transistor (OTFT) having different anisotropic alignment. It is found that the charge transport efficiency is increased with a better ordered molecular chain. For example, the carrier mobility can be increased by 100 times with better ordered molecular chain. This proves that the molecular alignment of an organic molecule is very important to enhancement of the electrical properties of TFTs. (Nature, Vol. 401, p.685, 1999).

The technology of controlling alignment of an organic molecule can be classified into the following three types.

(1) Self-organization: Sirringhaus et al. produce an organic integrated device including an organic thin film transistor (OTFT) and an organic light emitting diode (OLED). Functional groups in an organic molecule interact with the atom (such as silicon) in a substrate. The interaction provides the organic molecule with better alignment by self-organization. The molecular alignment of organic molecule in the transistor is thus controlled (Nature, Vol. 401, p.685, 1999).

(2) Rubbing or pulling: In U.S. Pat. No. 6,326,640, first, an orientation layer is formed by mechanical rubbing or electric or magnetic field pulling. Next, an organic layer is formed on the orientation layer. In this way, the organic molecule aligns according to the alignment of the orientation layer.

(3) Solvent annealing: In U.S. Pat. No. 6,312,971, an organic semiconducting film is first deposited on a substrate by printing or spin-coating. A specific solvent is selected, such that the alignment of the organic semiconducting molecule is altered using the vapor of the solvent. The electrical properties of OTFT are thus improved.

The above-mentioned conventional technology can only provide the organic semiconducting molecule with the same alignment over the entire substrate. Different alignments in different regions over the same substrate cannot be achieved.

SUMMARY OF THE INVENTION

An object of the present invention is to solve the above-mentioned problems and provide a process for controlling the molecular alignment of an organic semiconducing molecule. The present invention can form an organic semiconducting layer with different molecular alignments in different regions over the same substrate. Therefore, the alignment of organic molecule in a transistor channel is accurately defined, thus, the device properties and circuit design are improved. Moreover, since the organic semiconducting layer has different alignments in different regions, it is possible to control the organic molecule to have better alignment in the OTFT channel region, thus providing better carrier transport efficiency during OTFT operation. Similarly, it is possible to control the organic molecule to have worse alignment in the non-channel region, thus providing worse carrier transport efficiency. In this way, current leakage and crosstalk between pixels can be decreased. Also, there is no need to directly pattern the organic material.

To achieve the above objects, the process for forming an organic semiconducting layer having molecular alignment includes the following steps. First, a photoalignment organic layer is formed on a substrate or a dielectric layer. Next, the photoalignment organic layer is irradiated by polarized light through a mask, such that the photoalignment organic layer becomes an orientation layer having molecular alignment. Finally, an organic semiconducting layer is formed on the orientation layer, such that the organic semiconducting layer aligns according to the alignment of the orientation layer to exhibit molecular alignment.

According to a preferred embodiment of the present invention, irradiating the photoalignment organic layer by polarized light through a mask includes the following steps. A predetermined region of the photoalignment organic layer is irradiated through a mask by polarized light having a predetermined direction. The above step of irradiating a predetermined region is repeated at least once, such that the orientation layer formed has at least two molecular alignments in at least two different regions. The polarized lights used in different irradiating steps have the same or different directions. The different irradiating steps irradiate different regions of the photoalignment organic layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
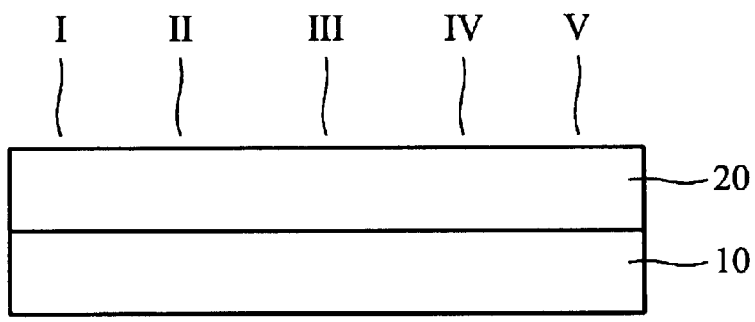
FIGS. 1a to 1c are cross-sections illustrating the process flow of forming an organic semiconducting layer having molecular alignment according to a preferred embodiment of the present invention.
Figure 1B:
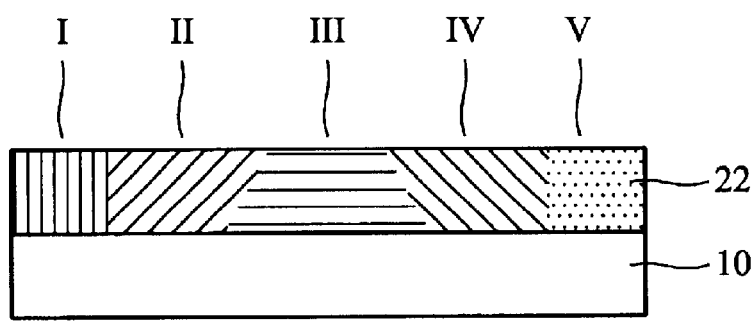
Figure 1C:
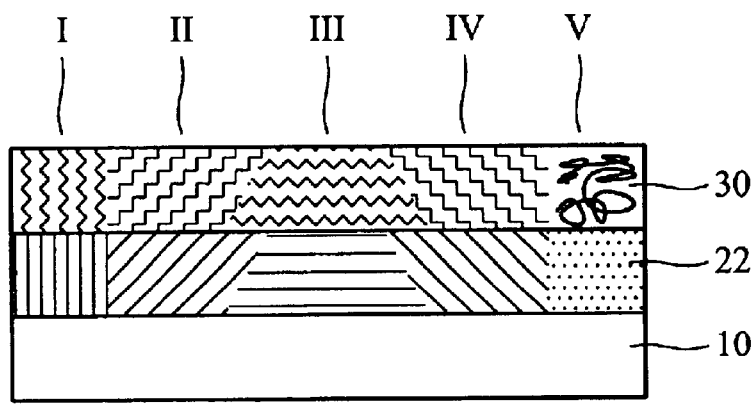

FIGS. 1a to 1c are cross-sections illustrating the process flow of forming an organic semiconducting layer having molecular alignment according to a preferred embodiment of the present invention.

Referring to FIG. 1a, a photoalignment organic layer 20 is formed on a substrate or a dielectric layer 10. Suitable substrate can be a silicon wafer, glass, quartz, a plastic substrate, or a flexible substrate.

Subsequently, the photoalignment organic layer 20 is irradiated by polarized light through a mask (not shown). In this way, the photoalignment organic layer 20 becomes an orientation layer 22 having molecular alignment as shown in FIG. 1b.

According to requirements, a plurality of irradiations can be performed on different regions of the photoalignment organic layer 20 using polarized light with different directions. In this way, the orientation layer 22 formed has at least two molecular alignments in at least two different regions. For example, referring to FIGS. 1a and 1b together, first, region I of the photoalignment organic layer 20 is irradiated by a first polarized light through a first mask (not shown, which masks regions II~V). Thus, region I of the orientation layer 22 formed has a first molecular alignment.

Subsequently, still referring to FIGS. 1a and 1b, region II of the photoalignment organic layer 20 is irradiated by a second polarized light through a second mask (not shown, which masks regions I and III~V). Thus, region II of the orientation layer 22 formed has a second molecular alignment.

Subsequently, still referring to FIGS. 1a and 1b, region III of the photoalignment organic layer 20 is irradiated by a third polarized light through a third mask (not shown, which masks regions I, II, IV, and V). Thus, region III of the orientation layer 22 formed has a third molecular alignment.

Subsequently, still referring to FIGS. 1a and 1b, region IV of the photoalignment organic layer 20 is irradiated by a fourth polarized light through a fourth mask (not shown, which masks regions I~III and V). Thus, region IV of the orientation layer 22 has a fourth molecular alignment. Region V of the orientation layer 22 is random (no molecular alignment).

Subsequently, an organic semiconducting layer is formed on the orientation layer 22. The organic semiconducting layer can be formed by deposition, such as vacuum evaporation, vapor deposition, solution deposition, or directional deposition. The organic semiconducting layer aligns according to the molecular alignment of the orientation layer 22, thus forming an organic semiconducting layer 30 with molecular alignment as shown in FIG. 1c. Finally, after the organic semiconducting layer 30 is formed, annealing can be performed.

As shown in FIG. 1c, the organic semiconducting layer 30 has the same alignment as the orientation layer 22 in regions I, II, III, and IV. Region V is random. Thus, the organic semiconducting layer 30 has different molecular alignment in different regions on the same substrate. Molecular alignment control on one substrate is thus achieved.

The inventive process for forming an organic semiconducting layer having molecular alignment can be utilized to fabricate various organic devices, such as organic light emitting diode (OLED) and organic thin film transistor (OTFT).

Figure 2A:
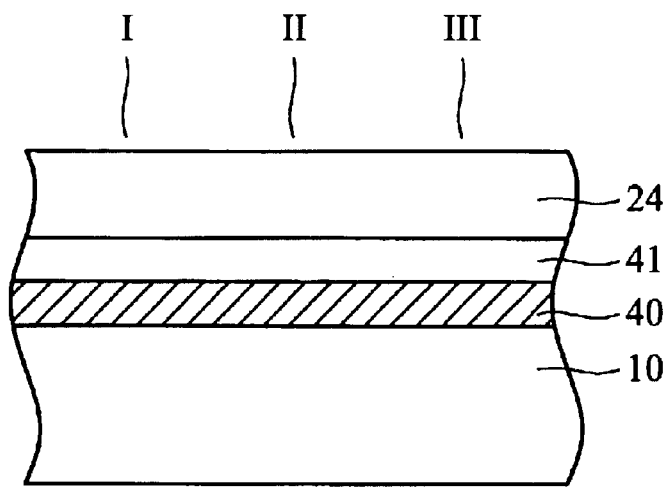
FIGS. 2a to 2c are cross-sections illustrating the process flow of forming an organic light emitting diode according to a preferred embodiment of the present invention.
Figure 2B:
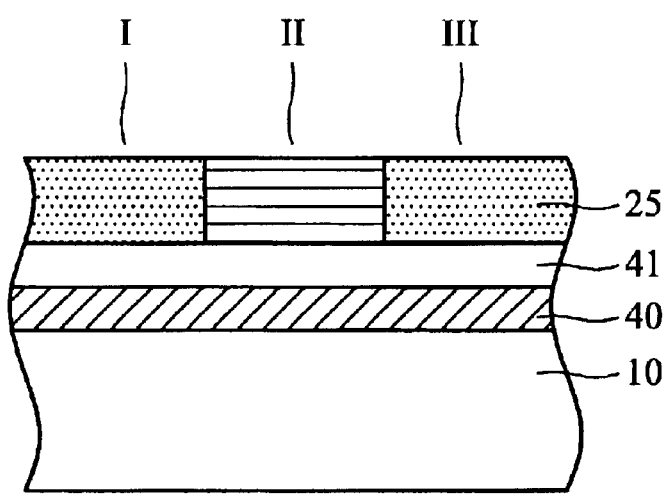
Figure 2C:
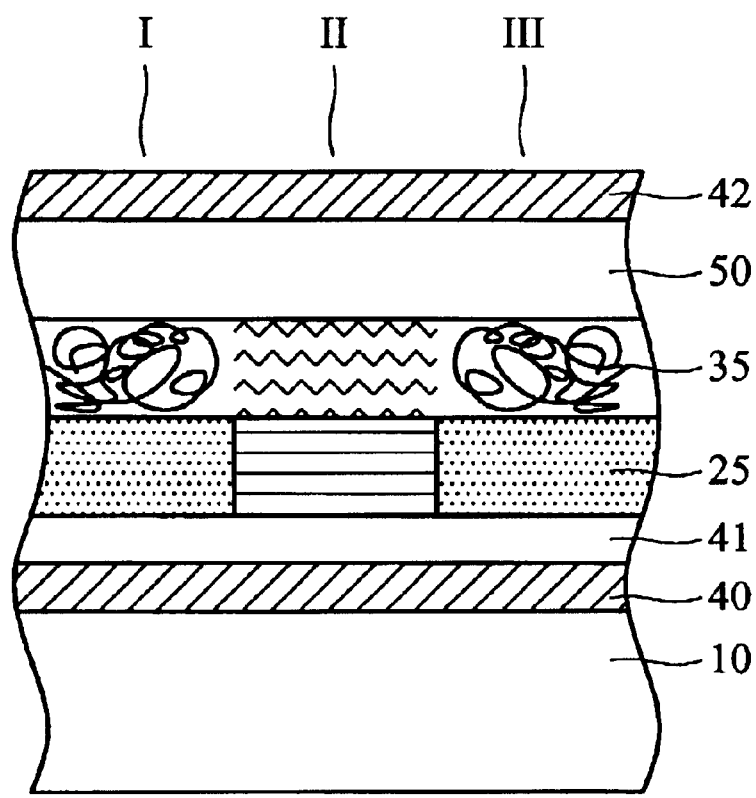

FIGS. 2a to 2c are cross-sections illustrating the process flow of forming an organic light emitting diode according to a preferred embodiment of the present invention. Referring to FIG. 2a, an anode 40 and a hole transfer layer 41 are successively formed on a substrate 10. Suitable substrate can be a silicon wafer, glass, quartz, a plastic substrate, or a flexible substrate. The anode 40 can be a semi-transparent electrode such as ITO (indium-tin-oxide) formed by sputtering. Next, a photoalignment organic layer 24 is formed on the hole transfer layer 41.

Subsequently, region II of the photoalignment organic layer 24 is irradiated by polarized light through a mask (not shown, which masks regions I and III). Thus, region II of the orientation layer 24 aligns to exhibit molecular alignment, thus forming an orientation layer 25 as shown in FIG. 2b. Regions I and III are random.

Similarly, according to requirements, a plurality of irradiations can be performed on different regions of the photoalignment organic layer 24 using polarized lights having different directions. In this way, the orientation layer 25 formed will have different molecular alignments in different regions.

Subsequently, referring to FIG. 2c, an organic semiconducting layer is formed on the orientation layer 25 to serve as a luminescent layer. The organic semiconducting layer aligns according to the molecular alignment of the orientation layer 25, thus forming an organic semiconducting layer 35 having molecular alignment. As shown in FIG. 2c, the organic semiconducting layer 35 has the same alignment as the orientation layer 25 in region II. Regions I and III are random.

Finally, still referring to FIG. 2c, an electron transfer layer 50 and a cathode 42 are successively formed on the organic semiconducting layer 35 to complete the fabrication of the OLED.

Figure 3:
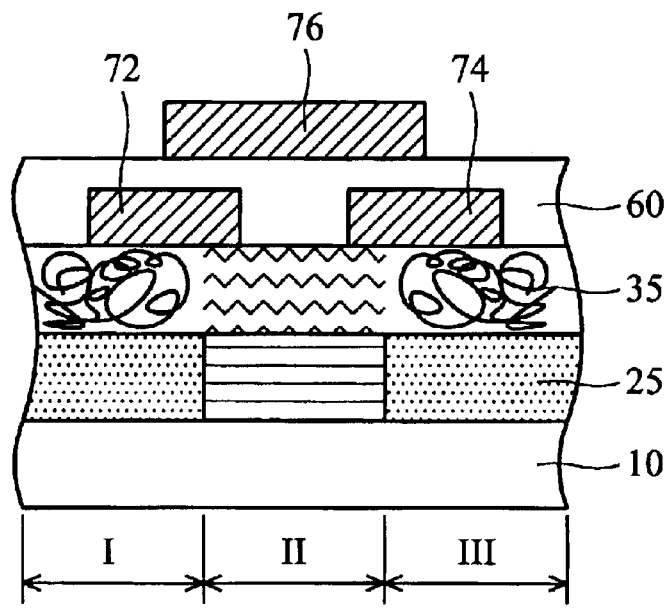
FIG. 3 shows a cross-section of a top-gate organic thin film transistor fabricated according to the process of the present invention.

FIG. 3 shows a cross-section of a top-gate organic thin film transistor fabricated according to the process of the present invention. The process of forming the semiconducting layer having molecular alignment is almost the same as that mentioned above; therefore, it is simply described below. A photoalignment organic layer is formed on a substrate 10. Region II of the photoalignment organic layer is irradiated by polarized light through a mask. Thus, region II of the photoalignment organic layer aligns to exhibit molecular alignment, thus forming an orientation layer 25. Next, an organic semiconducting layer is formed on the orientation layer 25. The organic semiconducting layer aligns according to the alignment of the orientation layer 25 to exhibit molecular alignment, thus forming an organic semiconducting layer 35 having molecular alignment. As shown in FIG. 3, the organic semiconducting layer 35 has the same alignment as the orientation layer 25 in region II. Regions I and III are random.

Subsequently, a metal layer is formed on the organic semiconducting layer 35 and then etched to form a source 72 and a drain 74. Next, a dielectric layer 60 is formed. The dielectric layer 60 can be inorganic material or polymeric material, preferably having a dielectric constant larger than 3. Finally, a gate 76 is formed.

Figure 4:
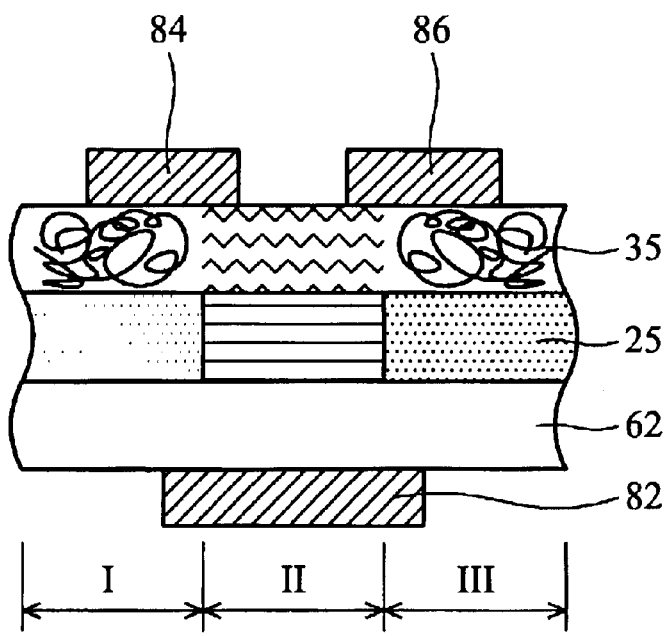
FIG. 4 shows a cross-section of a bottom-gate organic thin film transistor fabricated according to the process of the present invention.

FIG. 4 shows a cross-section of a bottom-gate organic thin film transistor fabricated according to the process of the present invention. The process of forming the semiconducting layer having molecular alignment is almost the same as that mentioned above; therefore, it is only simply described below. A gate 82 is formed on one surface of a dielectric layer 62 and a photoalignment organic layer is formed on the other surface of the dielectric layer 62. Next, region II of the photoalignment organic layer is irradiated by polarized light through a mask. Thus, region II of the photoalignment organic layer aligns to exhibit molecular alignment, thus forming an orientation layer 25. Next, an organic semiconducting layer is formed on the orientation layer 25. The organic semiconducting layer aligns according to the alignment of the orientation layer 25 to exhibit molecular alignment, thus forming an organic semiconducting layer 35 having molecular alignment. As shown in FIG. 4, the organic semiconducting layer 35 has the same alignment as the orientation layer 25 in region II. Regions I and III are random. Finally, a metal layer is formed on the semiconducting layer 35 and then etched to form a source 84 and a drain 86.

In conclusion, the present invention uses polarized light exposure through a mask to define the molecular alignment of an orientation layer. An organic semiconducting layer is formed on the orientation layer and aligns according to the molecular alignment of the orientation layer. Exposure to different regions of the photoalignment organic layer using polarized lights with different directions can obtain an organic semiconducting layer with different alignments in different regions over the same substrate. In this way, the alignment of organic molecule in a transistor channel is accurately defined, thus, the device properties and circuit design are improved. Moreover, since the organic semiconducting layer has different alignments on different regions, it is possible to control the organic molecule to have better alignment in the OTFT channel region, thus providing better carrier transport efficiency during OTFT operation. Similarly, it is possible to control the organic molecule to have worse alignment in the non-channel region, thus providing worse carrier transport efficiency. In this way, current leakage and crosstalk between pixels can be decreased. Also, there is no need to directly pattern the organic material.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for forming an organic device, comprising the following steps:

forming a photoalignment organic layer on a substrate or a dielectric layer;

irradiating the photoalignment organic layer by polarized light through a mask, such that the photoalignment organic layer becomes an orientation layer having molecular alignment;

forming an organic semiconducting layer on the orientation layer, such that the organic semiconducting layer aligns according to the alignment of the orientation layer to exhibit molecular alignment; and forming an electrode, wherein the organic device is an organic light emitting diode (OLED) and the process includes the following steps:

irradiating the photoalignment organic layer by polarized light, such that the photoalignment organic layer becomes an orientation layer having molecular alignment; and forming an organic semiconducting layer on the orientation layer to serve as a luminescent layer, such that the organic semiconducting layer aligns according to the alignment of the orientation layer to exhibit molecular alignment; and successively forming an electron transfer layer and a cathode on the organic semiconducting layer.

2. A process for forming an organic device, comprising the following steps:

forming a photoalignment organic layer on a substrate or a dielectric layer;

irradiating the photoalignment organic layer by polarized light through a mask, such that the photoalignment organic layer becomes an orientation layer having molecular alignment;

forming an electrode, wherein the organic device is an organic thin film transistor (OTFT) and the process includes the following steps:

forming a photoalignment organic layer on a substrate or a dielectric layer;

irradiating the photoalignment organic layer by polarized light, such that the photoalignment organic layer becomes an orientation layer having molecular alignment;

forming an organic semiconducting layer on the orientation layer, such that the organic semiconducting layer aligns according to the alignment of the orientation layer to exhibit molecular alignment; and forming a dielectric layer, gate, source and drain.

3. The process as claimed in claim 2, wherein the dielectric layer has a dielectric constant larger than 3.

4. The process as claimed in claim 3, wherein the dielectric layer is inorganic material or polymeric material.

5. The process as claimed in claim 2, wherein the organic device is a top-gate organic thin film transistor.

6. The process as claimed in claim 2, wherein the organic device is a bottom-gate organic thin film transistor.

* * * * *